(12) United States Patent
Vakada et al.

(10) Patent No.: US 7,031,900 B1
(45) Date of Patent: Apr. 18, 2006

(54) STATIC SCHEDULING OF TEST CASES

(75) Inventors: Sridhar Vakada, Sunnyvale, CA (US); Jurgen M. Schulz, Pleasanton, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/479,774

(22) Filed: Jan. 7, 2000

(51) Int. Cl.
*G05F 17/50* (2006.01)
*G05F 9/455* (2006.01)

(52) U.S. Cl. .............................. 703/17; 703/2; 703/27; 716/5; 716/18

(58) Field of Classification Search ................. 703/16, 703/17, 2, 27; 708/102; 716/4, 5, 18; 710/130; 714/712
See application file for complete search history.

(56) References Cited

U.S. PATENT DOCUMENTS

| | | | | |
|---|---|---|---|---|
| 5,157,620 A * | 10/1992 | Shaar | ......................... | 703/16 |
| 5,550,760 A * | 8/1996 | Razdan et al. | ................ | 703/14 |
| 5,696,942 A * | 12/1997 | Palnitkar et al. | .............. | 703/17 |
| 5,862,361 A * | 1/1999 | Jain | ............................ | 703/16 |
| 5,923,867 A * | 7/1999 | Hand | .......................... | 703/14 |
| 6,112,023 A * | 8/2000 | Dave et al. | ................... | 703/27 |
| 6,178,542 B1 * | 1/2001 | Dave | ........................... | 716/18 |
| 6,233,540 B1 * | 5/2001 | Schaumont et al. | .......... | 703/14 |
| 6,253,365 B1 | 6/2001 | Baldwin | ...................... | 716/18 |
| 6,285,914 B1 | 9/2001 | Bae et al. | ................... | 700/121 |
| 6,324,495 B1 * | 11/2001 | Steinman | ..................... | 703/17 |
| 6,339,837 B1 | 1/2002 | Li | ................................. | 716/5 |
| 6,493,739 B1 * | 12/2002 | Dolin et al. | ................ | 718/102 |
| 6,567,957 B1 * | 5/2003 | Chang et al. | .................. | 716/4 |

* cited by examiner

*Primary Examiner*—Thai Phan
(74) *Attorney, Agent, or Firm*—Meyertons Hood Kivlin Kowert & Goetzel, P.C.; B. Noël Kivlin

(57) ABSTRACT

A system and method for the static scheduling of test cases. A static scheduler is used to schedule the entire verification test of an integrated circuit in advance. The static scheduler is used in conjunction with a hardware description language (HDL) circuit design, a virtual test bench, and simulation software. The static scheduler is configured to assign test events to resources, or functional units, of the integrated circuit design. Events for a resource are assigned to available time slots, or cycles. During event scheduling, the static scheduler is configured to ensure that there are no resource conflicts for a given time slot. By scheduling all test events in advance, pitfalls associated with dynamic scheduling may be avoided, such as those associated with the use of semaphores. By avoiding the use of semaphores, complex test scenarios and boundary conditions may be more fully exercised, as resources will not be locked. This may allow a more thorough verification of an integrated circuit design.

20 Claims, 7 Drawing Sheets

| Port \ Time Slot | 1 | 2 | 3 | 4 | 5 | 6 | 7 | 8 | 9 | 10 |
|---|---|---|---|---|---|---|---|---|---|---|
| Port 1 | Drive Data Packet A to Port 1, Load Port 1 FIFO | | Drive Data Packet D to Port 1, Load Port 1 FIFO | | Read Data Packet D from Port 1 FIFO, Drive out of Port | | | | | |
| Port 2 | | | | | | | | | | |
| Port 3 | | | | | | | | | | |
| Port 4 | Drive Data Packet B to Port 4, Load Port 4 FIFO | | | | | | | | | |
| Port 5 | | | | | | | | | | |
| Port 6 | | | Read Data Packet A from Port 1 FIFO, drive from Port 6 | | | | | | | |
| Port 7 | Drive Data Packet C to Port 7 | Load Data Packet C to Port 7 FIFO | | | | | | | | |
| Port 8 | | | | | | Read Data Packet C from Port 7 FIFO | Drive Data Packet C from Port 8 FIFO | | | |
| Port 9 | | | | | | | | | | |
| Port 10 | | | | | | | | | | |

Fig. 4

```
class DATA_PACKET {
    bit [35:0] data;            //data to drive
    bit [2:0] parity;           //parity for data
} class CONTROL_PACKET extends DATA_PACKET {     //packet
info
    integer active_packet;      //signal if packet is valid to drive
    integer bypass;             //will data bypass input fifo
    bit [3:0] source;           //port to drive data in 0 to 9
    bit [3:0] dest;             //port to drive data out 0 to 9
    integer time_load;                //time to load data
    integer time_source;        //time to drive data
} class PORT_INFO {
    integer busy [CYCLE+2];           //port in use
    integer slow_busy [CYCLE+2]; //port in use
    integer fifo_item [CYCLE+2];  //items in fifo
    integer last_time_load;     //when was last loaded
    integer last_time_source;         //when was last source
}
```

*Fig. 5A*

```
//initialise port array
printf("INFO: Initialising port data array\n");
for (i=0;i<PORTS; i++) {
  port_info[i] = new;
  port_info[i].last_time_load = 0;
  port_info[i].last_time_source = 0;
  for (cycle_num=0;cycle_num<CYCLE; cycle_num++) {
    port_info[i].busy[cycle_num] = 0;     //port not busy
    port_info[i].slow_busy[cycle_num] = PORTS; //assign to unused port number
    port_info[i].fifo_item[cycle_num] = 0;  //fifo empty
  }
}
```

*Fig. 5B*

```
schedule_packet = 1;
   while (schedule_packet) {      //find an idle cycle

//printf("DEBUG: busy %d\n",port_info[port_in].busy[cycle_num]);
   //check to see input bus idle
   if (slowp(port_in))
     bus_busy = (port_info[port_in].busy[cycle_num] ||
           port_info[port_in].busy[cycle_num+1] );
   else
     bus_busy = (port_info[port_in].busy[cycle_num]);

//add a number of random cycles before loading
   if (!bus_busy && (test_phase == 2)) {        //only add during phase 2
     if (random()%LOAD_RATE == 0) {  //do we want to add cycles ?
        cycle_increment = (random() % LOAD_DLY);
      if (cycle_increment!=0)       {//if we dont want to use this cycle
        bus_busy = 1;
          cycle_num += cycle_increment;
          printf(" INFO: added a load delay of %d to packet %d\n",cycle_increment,i);
       }
     }
   }

//fifo is full can load any data
   fifo_full = (port_info[port_in].fifo_item[cycle_num] >= MAX_SAFARI_FIFO);

if (!bus_busy && !fifo_full) { //port idle
     port_info[port_in].busy[cycle_num] = 1;
     if (slowp(port_in))             //slow port, add another busy cycle
       port_info[port_in].busy[cycle_num+1] = 1;
     packet[i].time_load = cycle_num;
     port_info[port_in].last_time_load = cycle_num;

schedule_packet = 0;
   }
   cycle_num++;
   if (cycle_num >= CYCLE) {
     error("ERROR: ran out of cycles, increase CYCLE define in testbench\n");
   }
 }
```

*Fig. 5C*

```
//can't source until last cycle was sourced or before it was loaded
  //decide when to drive cycle out
  if (packet[i].time_load > port_info[port_in].last_time_source) {
    cycle_num = packet[i].time_load;
  }
  else {
    cycle_num = port_info[port_in].last_time_source;
  }
  //add a number of random cycles befoure sourcing
  if (i==(test_phase*TEST_PHASE_LENGTH)) {
    printf("INFO: test phase %d\n",test_phase);
    test_phase ++;
  }   //during last phase go back to max bypass
  if (test_phase != TEST_PHASE_NUM)
    cycle_num += (random() % test_phase)*SOURCE_MULT;
  schedule_packet = 1;
  while (schedule_packet) {   //find an idle cycle
    //do not immediately bypass a slow port, as it takes 2 cycles to
    //load the input port
    bypass_slow = ((packet[i].time_load == cycle_num) && slowp(port_in));
    //if previous source was from a slow port and we are trying to access a
    //slow port again, add bubble
         //check for same port
    double_slow = (port_info[port_out].slow_busy[cycle_num] == port_in);
    //check to see output bus idle
    if (slowp(port_out))
      bus_busy = (port_info[port_out].busy[cycle_num+2] ||
                     port_info[port_out].busy[cycle_num+3] );
    else
      bus_busy = (port_info[port_out].busy[cycle_num+2]);
    if (!bus_busy &&!bypass_slow && !double_slow) {
      port_info[port_out].busy[cycle_num+2] = 1;
      if (slowp(port_out))     //slow port, add another busy cycle
        port_info[port_out].busy[cycle_num+3] = 1;
      packet[i].time_source = cycle_num;
      if (fastp(port_out)) {
        port_info[port_in].last_time_source = cycle_num + 1;
      }
           else {
             port_info[port_in].last_time_source = cycle_num + 2;
           }
      if (fastp(port_in)) {
           //calculate if cycle is a bypass
        if (packet[i].time_load == packet[i].time_source) { //byapss
          packet[i].bypass = 1;
        }
      }
      else {
           //signal that we have sourced a slow port
           port_info[port_out].slow_busy[cycle_num+1] = port_in;
           //slow source port bypassed one cycle later
        if ((packet[i].time_load+1) == packet[i].time_source) { //byapss
          packet[i].bypass = 1;
        }
      }
      //update fifo depth for that port, start at the first packet
      for (j=packet[0].time_load; j<packet[i].time_source; j++) {
        port_info[port_in].fifo_item[j]++;
      } schedule_packet = 0;
    } cycle_num++;
    if (cycle_num >= CYCLE) {
      error("ERROR: ran out of cycles, increase CYCLE define in testbench\n");
    }
```

*Fig. 5D*

STATIC SCHEDULING OF TEST CASES

BACKGROUND OF THE INVENTION

1. Field of the Invention

This invention relates to design verification of integrated circuits, and more specifically, to the scheduling of specific test events.

2. Description of the Related Art

A common method of designing integrated circuits involves the use of a hardware description language, or HDL. Once an initial design is completed, simulations may be run to verify the behavior of the circuit. If the circuit does not meet behavioral specifications, the design may be modified to allow the circuit to perform its desired function. The ability to verify a design at a simulation level prior to constructing working hardware models may allow for significant cost savings in the overall design process.

In order to test a circuit during the design phase, many designers use a virtual test bench. A virtual test bench is a software package that allows a user to construct a virtual environment in which the simulation will take place. This virtual environment may include input stimuli and models of external devices, as well as a model of the device under test (DUT). In some cases, the virtual test bench is a component of the hardware description language used to design the circuit, while a separate software package is used to effect the simulation. For example, the hardware description language Verilog may use a software package known as Verilog-XL. The Verilog-XL package is used to simulate the virtual test bench environment specified by the Verilog hardware description language.

For a given simulation, a user may describe a specific set of events which are to occur. These events will employ the various resources of the DUT in order to verify their function. Such resources may include input/output ports, FIFO (first-in first out) memories, registers, drivers, and other functional units/circuitry. Typically, the scheduling of the specified events occurs dynamically during the actual simulation. One hazard of using dynamic scheduling is the possibility of resource conflicts. Such resource conflicts may be prevented by the use of semaphores. A semaphore will lock the resource in use, preventing its use by other resources at a given time, as well as preventing the simulation from attempting to use the resource for multiple events simultaneously.

Although semaphores may simplify the dynamic scheduling of events in a simulation, there may be overhead associated with their use. Using a semaphore to lock a resource during a given test may not allow the full functionality of the given resource to be properly tested. For example, a typical FIFO memory may be read from and written to simultaneously, even when the FIFO is full. However, when the simulated FIFO is locked by a semaphore, simultaneous FIFO reading and writing may be blocked. This can result in an incomplete test of the FIFO memory. As an alternative, the simulation may be accomplished without the use of semaphores, but this may lead to resource conflicts that may potentially result in the performance of illegal operations.

Because of the limitations of dynamic scheduling, it is possible that some complex test scenarios will not be simulated during a given test. In order to verify the full functionality of a given resource, multiple simulations may need to be performed. In some cases, it may be impossible, even with multiple simulations, to verify the full functionality of a resource using dynamic scheduling.

SUMMARY OF THE INVENTION

The problems outlined above are solved largely by a system and method for static scheduling of test cases. In one embodiment, a static scheduler is used to create a plurality of arrays, each array including a plurality of time slots. Events are then scheduled into available time slots. Each of these events may be defined as the allocation of a specific resource during the given time slot of the simulation, with a predefined action taking place on the resource. For example, an event may be defined as driving a data packet to an input port during a specified clock cycle. When assigning events to an array of time slots, the scheduler will check each of the events previously assigned to the plurality of arrays for resource conflicts. When a given resource is free for a given time slot, an event may then be assigned to that resource in that time slot. The scheduler will continue to assign events to time slots in the various arrays until the specified events for each resource are allocated to time slots.

In one embodiment, the device under test (DUT) is an integrated circuit design created using a hardware description language (HDL). The HDL software package includes a virtual test bench that may be used to create a virtual test environment for the DUT. The virtual test environment may include information about the data to be driven to and from the DUT, interconnecting components, and timing. The virtual test bench may also be used to define boundary conditions for the DUT. A simulation software package may then be used to create a verification test for the integrated circuit design based on information from hardware description and the virtual test bench. The simulation software package implements a programming language, which is used to program the static scheduler. The static scheduler may be used to schedule test events in prior to performing the simulation, ensuring that there are no resource conflicts in anytime slots of the simulation. When the desired test events have been scheduled, the simulation software may then perform the verification test on the integrated circuit design.

Thus, in various embodiments, the system and method for static scheduling of test cases may allow for greater control of verification tests for integrated circuit designs. Since semaphores are not used (as they are when dynamic scheduling is performed), resources (i.e. functional units of the designed circuit) are not locked during simulation. Boundary conditions, such as simultaneous reading and writing of a first-in first-out (FIFO) memory may be more thoroughly tested since resources such as these will not be locked by a semaphore when a single event is applied to them. Static scheduling may allow for more complex test scenarios, thereby yielding a more thorough verification test for an integrated circuit design.

BRIEF DESCRIPTION OF THE DRAWINGS

Other objects and advantages of the invention will become apparent upon reading the following detailed description and upon reference to the accompanying drawings in which:

FIG. 4 is a simplified example of an array produced by the static scheduler for testing the crossbar switch;

FIG. 5A is a section of source code from the static scheduler for defining data packets and port information for testing the design of the crossbar switch integrated circuit;

FIG. 5B is a section of source code from the static scheduler for initializing the arrays which define the schedule of test events;

FIG. 5C is a portion of the source code from the static scheduler for assigning events to the time slots of the arrays; and, FIG. 5D is a portion of the source code from the static scheduler for finding an empty time slot to drive data out of the crossbar switch.

Figure 1:
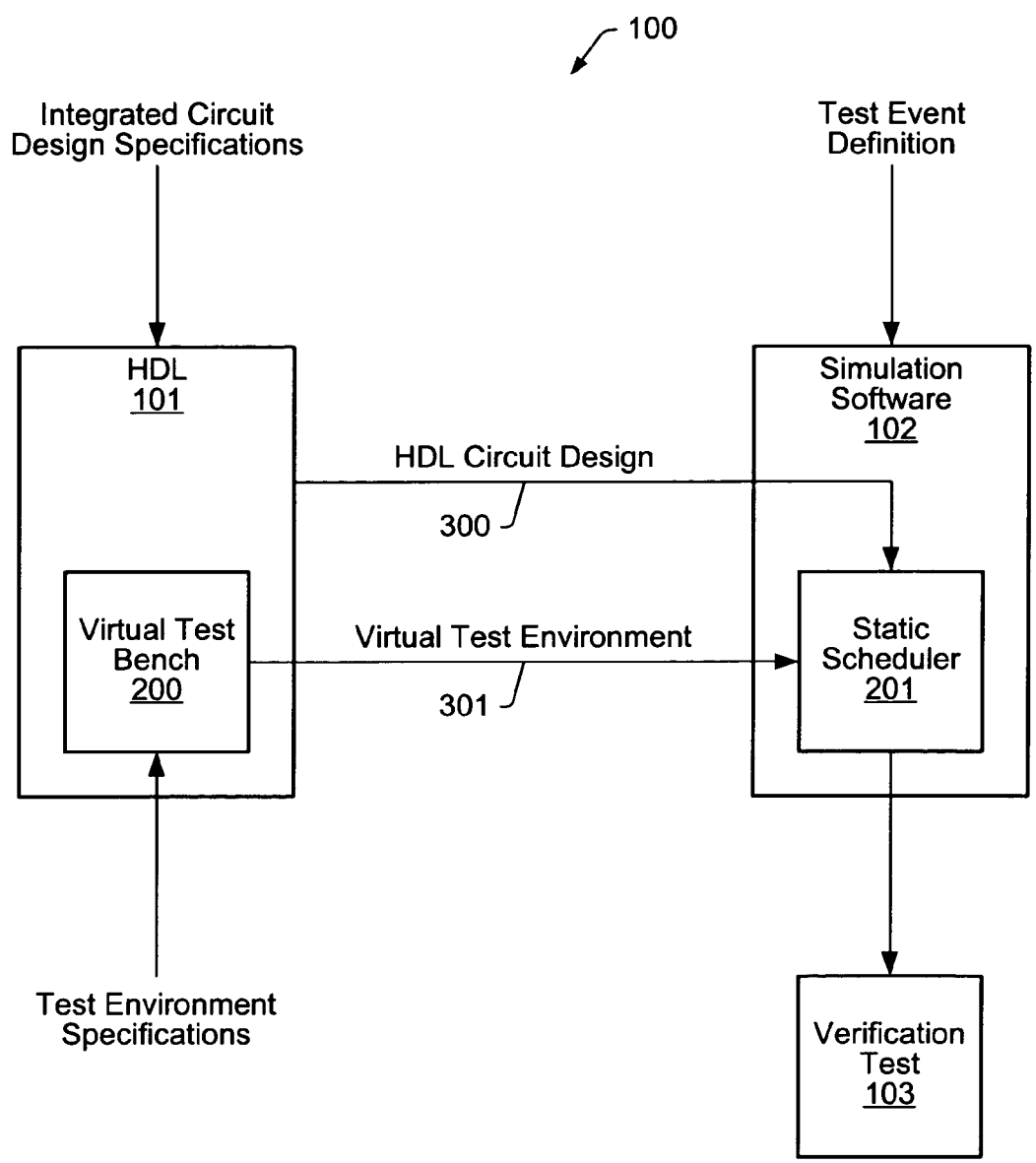
FIG. 1 is a block diagram of the verification test system.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scoped of the present invention as defined be the appended claims.

DETAILED DESCRIPTION OF THE INVENTION

Turning now to FIG. 1, a block diagram of the verification test system is shown. In this embodiment, verification test system 100 is configured to create and run tests of integrated circuit designs prior to actual fabrication of the circuit. Verification test system 100 includes three main components: a hardware description language (HDL) 101, simulation software 102, and the verification test 103, which is created as a result of inputs to simulation software 102.

Typically, HDL 101 will be part of a software package, such as Verilog. Other embodiments using different HDL software packages are contemplated. Using HDL 101, a circuit designer may input an integrated circuit design by creating a source code file. The source code file may be created based on integrated circuit design specifications decided upon before commencing the actual design. The source code file typically describes the functional behavior of the circuit, and may describe desired electrical characteristics as well. The behavior described in the source code file may be a simple as that of basic logic function, such as an inverter, an AND gate, an OR gate, or other function. Conversely, a source code file created with HDL 101 may describe behavior for very complex functions, such as an execution unit of a microprocessor or a functional unit of an application specific integrated circuit (ASIC). It should also be noted that HDL 101 may describe the behavior of either analog or digital circuits, or hybrids thereof.

When the circuit description of the source code written with HDL 101 is complete to the designer's satisfaction, the process of synthesis may begin. Synthesis is the process of creating the actual physical circuit design. In order to begin synthesis, the designer may specify various constraints such as circuit area, electrical characteristics, clocking periods, and so on. With these constraints specified, the synthesis is begun. If successful, a physical design of the circuit is created which can be used to create working models.

In the embodiment shown, the software package for HDL 101 includes virtual test bench 200. Other embodiments in which the virtual test bench may be a stand-alone application or part of another application are contemplated. Virtual test bench 200 is used to create a virtual test environment in which the integrated circuit design will be tested. The environment created using virtual test bench 200 may include virtual models of external devices to which the integrated circuit is to be coupled, such as other integrated circuits. Discrete components, such as resistors or capacitors, as well as system buses may be modeled as well. Test environment specifications are provided as inputs to virtual test bench 200. These specifications may define exactly which types of devices, components, and buses are to be modeled as coupled to the integrated circuit design. The test environment specifications may also allow the virtual test bench to add other parameters to the virtual test environment, such as timing intervals or electrical specifications. In the embodiment shown, in which virtual test bench 200 is a component of the software package for HDL 101, the virtual test environment may be described using the same hardware description language as the integrated circuit design.

Simulation software 102 is a software package is configured to create and perform the actual verification test of the integrated circuit design. Simulation software 102 is configured to receive HDL circuit design 300 and virtual test environment 301 as inputs. Also received by simulation software 102 are test event specifications, which specify the specific events of the test which are to take place. Typically, an event is defined as an action taking place on a resource of the integrated circuit design. For example, reading the contents of a register may be defined as an event, as well as writing to an on-board cache memory.

Included in this embodiment of simulation software 102 is static scheduler 201. Static scheduler 201 is configured to schedule events to resources, ensuring that there are no resource conflicts. Static scheduler 201 creates a plurality of arrays which define the schedule of events for the verification test. Arrays may be organized in a number of different ways. For example, in one embodiment, a plurality of one-dimensional arrays corresponding to resources of the integrated circuit may be defined. Each element of the array may be a time slot, or clock cycle, to which events for that resource are defined. Initially, all time slots will be empty. Static scheduler 201 will begin by assigning an event to a resource in an open time slot. With each subsequent assignment, static scheduler 201 will search all arrays for resource conflicts prior to assigning an event to a resource. For example, if the static scheduler intends to assign an event such as the driving of a data packet to a port from a source external to the device under test (DUT), it may first check all other arrays in order to ensure that no other port or external source is attempting to simultaneously drive data to the same port. This process repeats until assignment of events to resources is complete. By creating arrays in this manner, the entire verification test may be scheduled prior to its actual execution, which may allow the avoidance of the pitfalls associated with dynamic scheduling, as previously described.

The final output of the simulation software, following the scheduling of events, is verification test 103. Verification test 103 is configured to test the integrated circuit design and compare the results gathered during the test with expected results. Testing of the integrated circuit design may occur either prior to or following design synthesis. In many situations, testing will occur both prior to and following synthesis. For those tests which occur following synthesis, circuit-level testing may be performed in addition to functional level testing. Circuit level testing may allow the verification of desired electrical characteristics. Typically, functional level testing occurs both before and after synthesis. If the circuit does not test satisfactorily, the design may go through subsequent iterations in which adjustments and changes are made to the HDL source code file. Typically, integrated circuits pass through several design iterations prior to fabrication.

Figure 2:
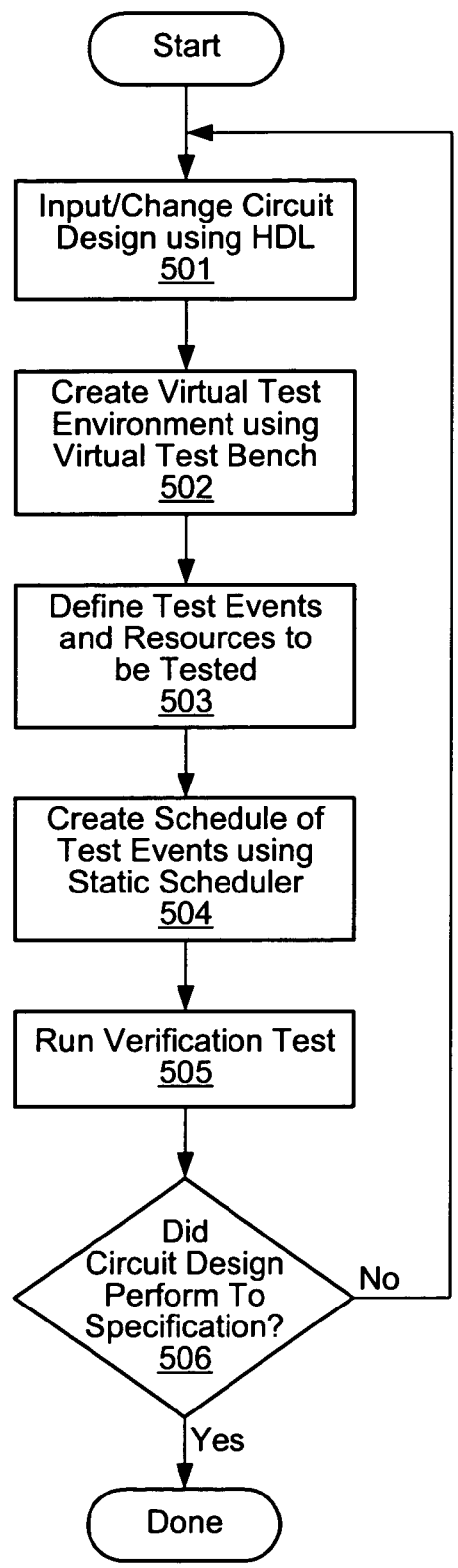
FIG. 2 is a flow chart of the design and verification process for one embodiment of the invention.

Moving now to FIG. 2, a flow chart of the design and verification process for one embodiment of the invention is illustrated. The process begins with the creation of an integrated circuit design using a HDL (block 501). Design specifications are coded into a HDL source code file which describes the behavior of the various functional units of the integrated circuit. When the behavior of the integrated circuit has been fully described, the designer may perform synthesis in order to create a circuit level implementation of the design. However, simulation may still be performed on a circuit design prior to performing synthesis, as is often the case.

With the initial design of the circuit complete, a virtual test bench may then be used to create a virtual test environment (Block 502). In some cases, the virtual test environment will be created through a source code file using the HDL that was used to create the circuit design. However, alternate embodiments are possible and contemplated. The virtual test bench may be used to create an environment that is similar to that in which the integrated circuit will be implemented. The virtual test environment may include models of other integrated circuits to which the design may be coupled to, buses, and discrete components. It is in this virtual environment that the integrated circuit design may then be tested.

Another part of the process of design and verification is the defining of test events (Block 503) which are to occur during the verification test. Test events may be defined as the various stimuli that are applied to the various functional units of the circuits. For example, if testing a microprocessor, one test event might involve sending instructions to an execution unit to verify that it responds correctly. Another example could include writing data to a FIFO memory, with a subsequent event reading of the same data at some later time. It may also be possible to apply failure conditions as events in order to gauge their effects on the circuit and its associated functional units.

Following the definition of the events, scheduling is performed (Block 504). The static scheduler is configured to use information from the HDL circuit design, the virtual test environment, and event definition in creating a test schedule. During creation of the test schedule, the static scheduler will assign events to resources, ensuring that no resource conflicts exist on a given resource at a given time. Using the static scheduler, all events may be scheduled in advance of actually performing the test. Since it is possible to prevent resource conflicts during the scheduling, semaphores are not required to lock resources.

When the scheduling is complete, the simulation software may then perform the verification test (Block 505). When the verification test is run, stimuli are applied to the various functional units (i.e. events) of the integrated circuit design. When testing is complete, the designer may then compare the expected results with the actual results to determine if the design performed as intended. If the design did not meet specifications, the designer may then go back to the beginning of the process and change the design as necessary (Block 506). Otherwise, the verification process is complete.

It should be noted that the flowchart shown here is not meant to imply that this specific sequence of processes applies to all embodiments of the invention. In contrast, some processes may occur in a different order than shown in FIG. 2 for alternate embodiments of the invention.

Figure 3:
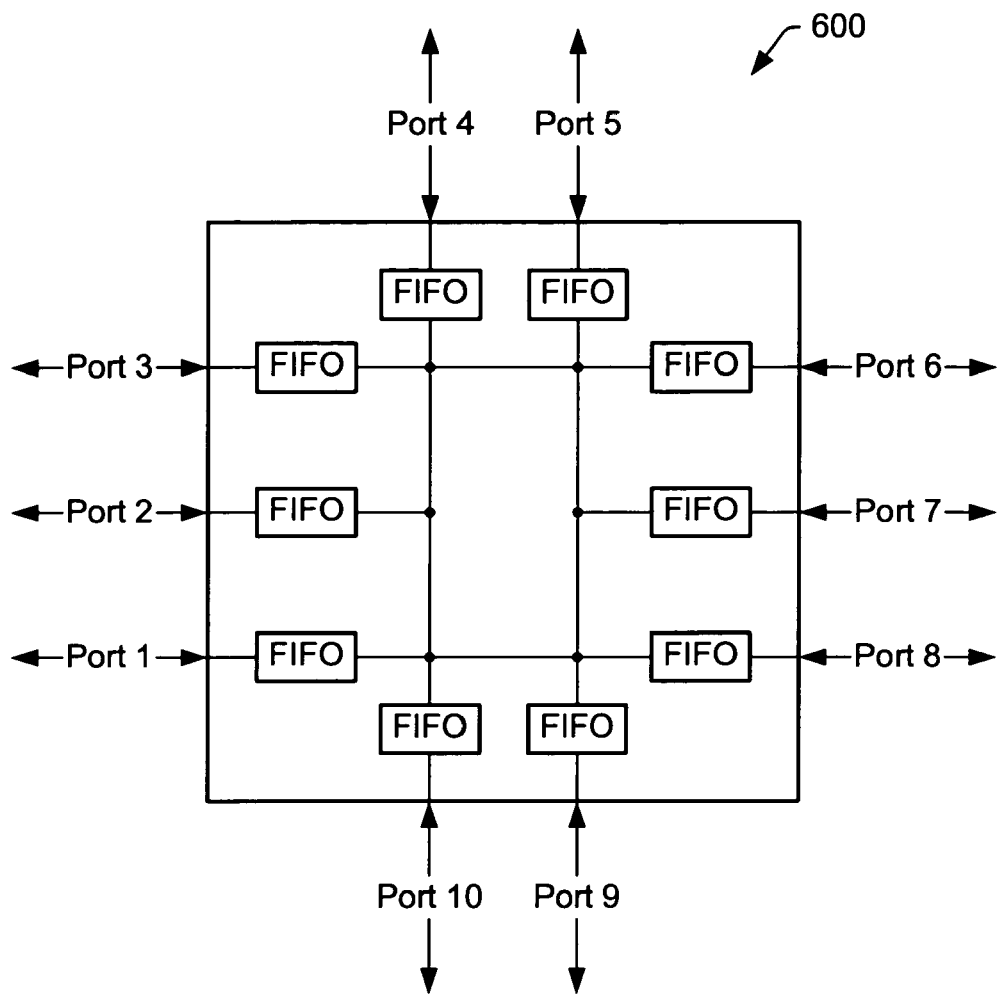
FIG. 3 is a block diagram of a crossbar switch integrated circuit.

Moving on to FIG. 3, a simplified block diagram of a crossbar switch integrated circuit is illustrated, and will be used as an example to further describe the invention. Crossbar switch circuit 600 is a switching circuit that includes 10 ports to which data may be driven to or from. Ports 1 through 6 take one clock cycle to move data, and are referred to as fast ports, while ports 7 through 10 need two clock cycles to move data, and are referred to a slow ports. Data packets may be driven to or from any one of the ten ports, and may be driven between two ports within the circuit. Each port also has a FIFO (first-in first-out) memory associated with it that may be used for temporary storage of data packets that are being driven between ports. Each FIFO contains separate ports for reading and writing of data, thus allowing simultaneous read and write operations. The various functions of crossbar switch circuit 600 may be described using HDL source code.

FIG. 4 is a simplified example of an array produced by the static scheduler for testing the crossbar switch. The array shown is a two-dimensional array, referenced horizontally by time slot and vertically by port number. The static scheduler schedules the events listed for a given port into a given time slot, ensuring that there are no resource conflicts. For the crossbar switch of FIG. 3, events scheduled within the array include driving data to and from a port, driving data between ports within the circuit, and reading and writing to the FIFO memory. A simultaneous write/read of the FIFO occurs in time slot #3. In this time slot, data packet D is written into the Port 1 FIFO after receiving the data packet from an external source. In the same time slot, data packet A, written into the Port 1 FIFO during time slot #1, is read from the Port 1 FIFO by Port 6 and then driven from port 6 to an external destination. The simultaneous read and write of the FIFO is made possible in this instance by the fact that semaphores are typically not used by the static scheduler. Thus, the resource (i.e. the FIFO) is not locked during the read or write operation, allowing both to take place simultaneously.

If it is desired to assign another event to the array, the static scheduler will typically first perform a search of the array for an empty time slot with respect to the resource to which the event will be applied. Once an empty time slot is found, the static scheduler may then search the time slot for conflicts with other resources. For example, if the event for a given time slot requires port 1 to drive a data packet to port 8, the scheduler is configured to ensure that port 8 may receive the data packet in the same time slot. If port 8 is scheduled for another event, such as driving data to another port, the event will then be scheduled in another time slot. The array size need not be fixed, thus allowing all predefined events to be assigned to the appropriate resources. When scheduling is complete, simulation software 102 of FIG. 1 may then perform the verification test.

FIGS. 5A, 5B, and 5C show various sections of the source code for the static scheduler. FIG. 5A is a section of source code from the static scheduler for defining classes for data packets and port information for testing the design of the crossbar switch integrated circuit. The function provided by the classes shown will be apparent to those skilled in the art of object oriented programming. Class DATA_PACKET is used to create the data packets that are transmitted to and from crossbar switch circuit 600 of FIG. 3 during simulation. The data packets include 36 data bits, and 3 parity bits for error checking. Class CONTROL_PACKET extends the DATA_PACKET class. This class embeds the data packet objects with control information. This control information includes the ports to which a given data packet will be driven to or from, load and drive times, and information to determine whether a data packet will be written into the FIFO after being driven into a port. The CONTROL_PACKET class may also direct the data packet to do a FIFO bypass for a given port, providing the output (destination) port is free, and the input port FIFO is empty. Class PORT_INFO embeds information into objects representing the ports of the crossbar switch circuit. Included is information about the state of the port (busy or idle) for both slow and fast ports, FIFO information, and the most recent load and source times. Using objects of these various classes, the static scheduler may determine when data packets can be driven to and from given circuit resources while avoiding conflicts with other circuit resources.

FIG. 5B is a section of source code from the static scheduler for initializing the arrays which define the schedule of test events. In this particular section of code, a one-dimensional array of events will be created for each port of the crossbar switch circuit. In this embodiment, elements of the arrays will be time slots (referred to in the code as cycles) in which no events are scheduled (i.e. open time slots). When arrays are initialized for all ports, they can be combined to form a single, two-dimensional array that is referenced by port number and time slot. The schedule may then use the two-dimensional array to assign events to resources.

FIG. 5C is a portion of the source code from the static scheduler for assigning events to the time slots of the arrays. In this embodiment, scheduling is enabled when the variable schedule_packet=1. As the commented section of code suggests, the scheduler will then begin looking for an idle cycle (i.e. time slot). The first task performed by the scheduler is to determine whether a bus coupled to a given port is busy. Since a slow port requires two cycles to move data, the scheduler is also configured to determine whether the given port is a slow or fast port. If the bus and the port are free, the scheduler may then schedule a data packet to be loaded to that port. The scheduler also records the time of the load in order to set the last_time_load variable. Other similar sections of source code exist for the static scheduler for events such as sourcing a data packet from a port or read/write operations on the FIFO.

Another function included in the code shown in FIG. 5C is the FIFO full read and write algorithm. This section of code may enable the static scheduler to perform a simultaneous read and write on a FIFO that is full. A variable, designated here port_info[i].fifo_item[cycle_num], stores the number of items in the FIFO for each of the ports. When a load is scheduled, it looks for the first cycle number ([cycle_num]) where the FIFO (corresponding to port_info [i]) is not full. As there is a delay between loading and sourcing in the FIFO, at the same time the source (i.e. read) takes effect there will also be a load (i.e. write).

The code shown in FIG. 5C also includes a section for checking cycle numbers in order to ensure that the scheduler does not attempt to assign events for a time slot that has not been initialized in an array. In this particular embodiment, the maximum array size is specified in the virtual test bench, although it may be specified elsewhere in alternate embodiments. If this error occurs, the user may simply increase the array size in the test bench and rerun the static scheduler using the new virtual test environment. Other embodiments employing dynamic data structures are possible and contemplated, wherein the array size may be automatically adjusted as necessary by the scheduler or other software.

Moving now to FIG. 5D, a portion of the source code from the static scheduler for finding an empty time slot to drive data out of the crossbar switch is shown. In this section of code, the variable cycle_num is incremented after the last load or source to or from a FIFO, and a number of random cycles is added to the sourcing time. After the variable schedule_packet is set to a true condition (schedule_packet=1), the schedule enters a while loop, which searches for an empty time slot. The scheduler will exit the while loop after a data packet is scheduled in an available time slot. Within the while loop, bypass slow and double_slow are used to determine if the port to be scheduled is a slow port, setting a flag if true. Another variable, bus_busy, is used to determine if the requested output port is idle. If the port is idle for a given time slot, sourcing of data in that time slot from the requested port FIFO may then be scheduled and the variable fifo_item updated to reflect the current number of data packets in the FIFO at a given time.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method of verifying a design of an integrated circuit comprising:
   defining said design of said integrated circuit using a hardware description language;
   defining a virtual test environment for said design of said integrated circuit using a virtual test bench;
   defining resources of said integrated circuit which need to be verified;
   defining events to be performed on said resources;
   using a static scheduler to create a schedule of said events to be performed on said resources; and,
   using simulation software to perform said verification test of said design of said integrated circuit within said virtual test environment by performing said events on said resources as determined by said schedule created by said static scheduler, wherein said schedule of events is created in its entirety prior to performing said verification test.

2. The method as recited in claim 1, wherein said verification test is configured to compare responses to each of said events performed on said events with predicted responses to each of said events.

3. The method as recited in claim 2, wherein said simulation software is configured to calculate said predicted responses to each of said events.

4. The method as recited in claim 1, wherein said static scheduler is configured to create a plurality of arrays defining the schedule of said events to be performed during said verification test.

5. The method as recited in claim 1, wherein said simulation software is configured to receive design information for said integrated circuit, said design information created using said hardware description language.

6. The method as recited in claim 1, wherein said simulation software is configured to receive as an input said virtual test environment from said virtual test bench.

7. The method as recited in claim 1, wherein said design of said integrated circuit is tested by said verification test at a functional level.

8. The method as recited in claim 1, wherein said design of said integrated circuit is tested by said verification test at a circuit level.

9. A system for verifying the design of an integrated circuit comprising:
- a hardware description language (HDL) representation of an integrated circuit design;
- a virtual test bench for creating a virtual test environment for said integrated circuit design;
- a static scheduler used to create a schedule of events for a verification test to be performed on resources of said integrated circuit design, wherein said schedule is created based on said HDL representation of said integrated circuit design and said virtual test environment, and wherein said schedule is created in its entirety prior to performing said verification test; and,
- simulation software configured to perform said verification test for verification of said integrated circuit design based on said schedule of events.

10. The system as recited in claim 9, wherein said resources include functional units of said integrated circuit design.

11. The system as recited in claim 10, wherein said simulation software is configured to calculate said predicted responses to each of said events performed on said resources.

12. The system as recited in claim 9, wherein said resources include input and output ports of said integrated circuit design.

13. The system as recited in claim 9, wherein said events include driving simulated signals to said resources.

14. The system as recited in claim 9, wherein said events include driving simulated signals from said resources.

15. The system as recited in claim 9, wherein said static scheduler is configured to create a plurality of arrays defining said schedule of events to be performed during said verification test, wherein each of said plurality of arrays corresponds to at least one of said resources.

16. The system as recited in claim 9, wherein said simulation software is configured to receive as an input source code file for said integrated circuit design.

17. The system as recited in claim 9, wherein said simulation software is configured to receive as an input said virtual test environment from said virtual test bench.

18. The system as recited in claim 9, wherein said verification test is configured to compare actual responses to each of said events performed on said resources with predicted responses to each of said events performed on said resources.

19. The system as recited in claim 9, wherein said integrated circuit design is tested by said verification test at a functional level.

20. The system as recited in claim 9, wherein said integrated circuit design is tested by said verification test at a circuit level.

* * * * *